(12) United States Patent
Visalli

(10) Patent No.: US 10,853,170 B2
(45) Date of Patent: Dec. 1, 2020

(54) ECC PROTECTED STORAGE

(71) Applicant: TEXAS INSTRUMENTS INCORPORATED, Dallas, TX (US)

(72) Inventor: Samuel Paul Visalli, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 62 days.

(21) Appl. No.: 16/122,939

(22) Filed: Sep. 6, 2018

(65) Prior Publication Data

US 2020/0081772 A1   Mar. 12, 2020

(51) Int. Cl.
*G06F 11/10* (2006.01)
*G11C 29/52* (2006.01)

(52) U.S. Cl.
CPC .......... *G06F 11/1068* (2013.01); *G11C 29/52* (2013.01)

(58) Field of Classification Search
CPC .................................................. F06F 11/1076
See application file for complete search history.

(56) References Cited

U.S. PATENT DOCUMENTS

| 5,517,631 A * | 5/1996 | Machado | G05B 19/0421 360/77.02 |
| 2008/0163014 A1* | 7/2008 | Crawford | G06F 11/1064 714/723 |
| 2010/0251036 A1* | 9/2010 | Moyer | G06F 11/1064 714/53 |
| 2014/0089602 A1* | 3/2014 | Biswas | G06F 12/0804 711/144 |

\* cited by examiner

*Primary Examiner* — Fritz Alphonse
(74) *Attorney, Agent, or Firm* — Ebby Abraham; Charles A. Brill; Frank D. Cimino

(57) ABSTRACT

A data storage circuit includes memory, an error correcting code (ECC) storage circuit, and control circuitry. The memory is configured to store a data value comprising a plurality of fields. Each of the fields is independently writable. The ECC storage circuit is configured to store an ECC value corresponding to the data value. The control circuitry is configured to receive a field value to be written into one of the fields, and store the field value in the one of the fields by writing only the field value to the memory. The control circuitry is also configured to retrieve the ECC value from the ECC storage circuit, compute an updated ECC value based on the ECC value retrieved from the ECC storage circuit and the field value, and store the updated ECC value in the ECC storage circuit.

20 Claims, 3 Drawing Sheets

ECC PROTECTED STORAGE

BACKGROUND

Semiconductor memories are susceptible to both hard and soft errors. Soft errors occur, for example, when sub-atomic energetic particles strike the memory and generate sufficient charge to upset the state of a memory cell. Hard errors are caused, for example, by defects in the semiconductor device created during manufacturing. Some semiconductor memories include error correcting code (ECC) circuitry to mitigate the effects of hard and soft errors. In an ECC protected memory, when a data value is written into the memory, the ECC circuitry computes an ECC value and the ECC value is stored in the memory in conjunction with a data value. The ECC circuitry uses the ECC value to detect, and possibly correct, errors in the data value when the data value is read from the ECC protected memory.

SUMMARY

A data storage circuit that writes data fields of a larger data value into an error correcting code (ECC) protected memory without performing a read-modify-write operation is disclosed herein. In one example, a data storage circuit includes memory, an ECC storage circuit, and control circuitry. The memory is configured to store a data value comprising a plurality of fields. Each of the fields is independently writable. The ECC storage circuit is configured to store an ECC value corresponding to the data value. The control circuitry is configured to receive a field value to be written into one of the fields, and store the field value in the one of the fields by writing only the field value to the memory. The control circuitry is also configured to retrieve the ECC value from the ECC storage circuit, compute an updated ECC value based on the ECC value retrieved from the ECC storage circuit and the field value, and store the updated ECC value in the ECC storage circuit.

In another example, a data storage circuit includes memory, an ECC storage circuit, and an ECC generation circuit. The memory includes a plurality of independently writable fields. The ECC storage circuit includes storage locations for an ECC value corresponding to the plurality of independently writable fields. The ECC generation circuit is coupled to the ECC storage circuit. The ECC generation circuit includes a first layer of exclusive-OR circuitry and a second layer of exclusive-OR circuitry. The first layer of exclusive-OR circuitry includes inputs coupled only to a port that provides a field value to be written into one of the independently writable fields. The second layer of exclusive-OR circuitry includes inputs coupled to the outputs of the first layer of exclusive-OR circuitry, inputs coupled to outputs of the ECC storage circuitry, and outputs coupled to the ECC storage circuitry.

In a further example, a method for storing data includes receiving a field value to be written into one of a plurality of independently writable fields of a memory. An ECC value corresponding to the plurality of independently writable fields is retrieved from an ECC storage circuit. An updated ECC value is computed based only on the field value and the ECC value. The updated ECC value is stored in the ECC storage circuit.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

In some data storage systems that include error correcting code (ECC) circuitry to protect stored data from memory errors, if any portion (e.g., a field that includes less than all) of a stored data value is to be written, then the entire stored data value is retrieved from storage. The retrieved value may be checked for correctness using an existing ECC value. The retrieved data value is modified with the new field value (and possibly correction of the previously stored data if supported and required). A new ECC value is computed based on the modified value, and the modified value and new ECC value are stored in memory. That is, a read-modify-write operation is performed to modify a field of a value stored in memory. While acceptable in some applications, use of the read-modify-write process is not time efficient, and is therefore undesirable in other applications.

The data storage system disclosed herein allows a portion of a data value that is protected by an ECC value to be updated without performing a read-modify-write operation with respect to the data value. That is, new data may be written into a portion of the data value without reading any portion of the data value for update of the ECC value. In implementations of the data storage system of the present disclosure, a stored data value and an ECC value that protects the data value are initialized to a selected value (e.g., zero) before any portion of the data value is updated. As data to be written into the various portions or fields of the data value is received, the data is written into the field without reading any portion of the data value, and the ECC value is read and updated in based on the data written into the field and the current ECC value. Implementations may store the ECC separately from the data value, and reduce the complexity of the ECC read-back path to improve ECC computation performance. Thus, the data storage system of the present disclosure provides improved performance when writing a field of a larger data value.

Figure 1:
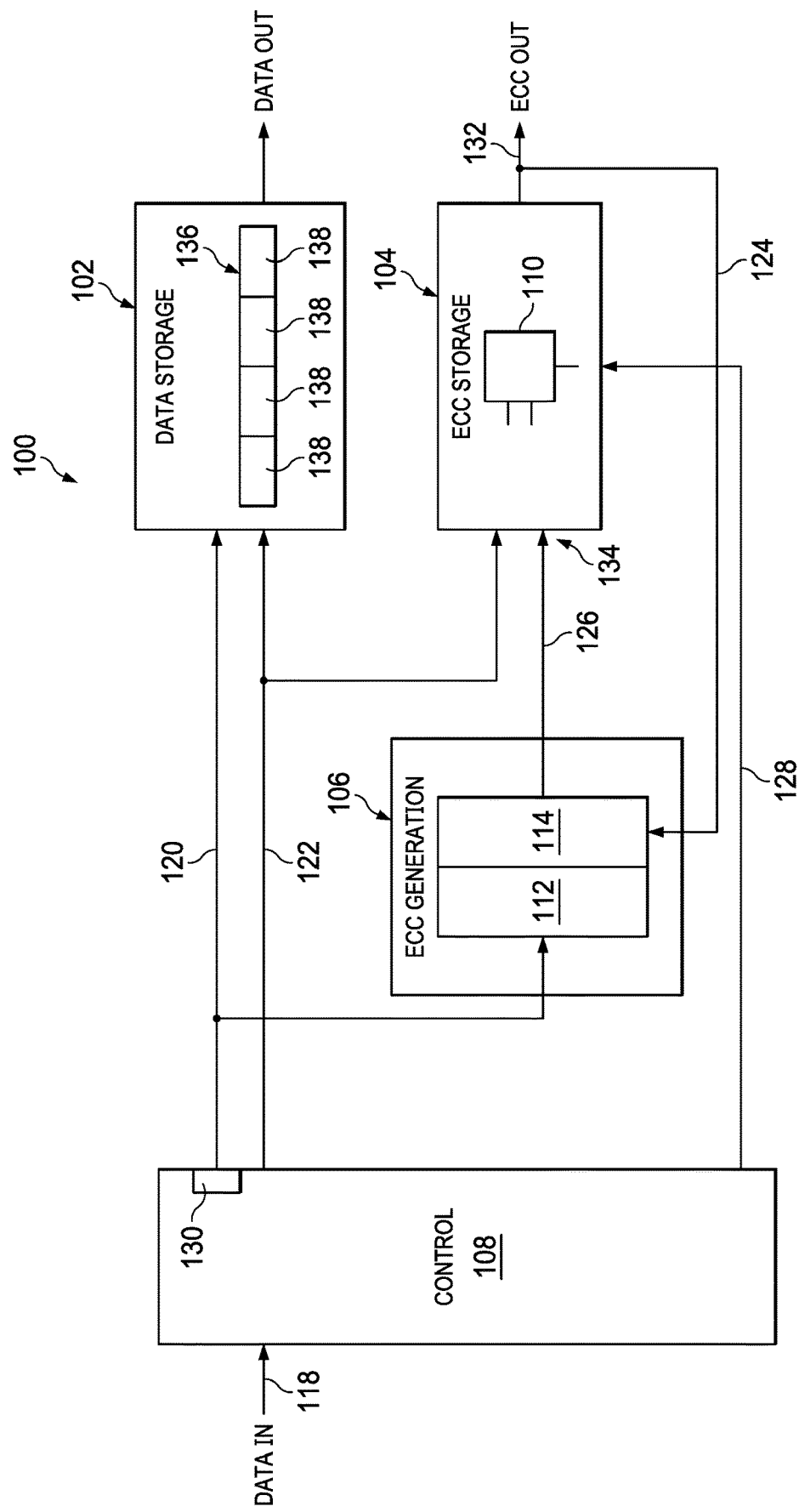
FIG. 1 shows a block diagram for an example data storage circuit in accordance with the present disclosure.

FIG. 1 shows a block diagram for an example data storage circuit 100 in accordance with the present disclosure. The data storage circuit 100 includes a memory 102 (i.e., a data storage circuit), an ECC storage circuit 104, an ECC generation circuit 106, and a control circuit 108. The memory 102 may be a static random access memory, a dynamic random access memory, or other type of semiconductor memory device. The memory 102 includes a storage location 136. The memory 102 may include any number of storage locations 136 and memory cells as needed to store a selected number of data values. The storage location 136, and a data value stored therein, includes a plurality of fields 138, and the memory 102 allows each of the fields 138 of the data value to be independently written. For example, the memory 102 may store a data value that is 64 bits in length, and allow each of the eight byte-wide fields of the data value to be written without accessing (reading or writing) any of the other seven fields of the data value. The memory 102 writes data 120 into memory cells as directed by the control signals 122, which may include address signals, field selection signals, read/write control signals, etc.

The ECC storage circuit 104 stores an ECC value corresponding to each data value of the memory 102. In some implementations of the data storage circuit 100, the ECC storage circuit 104 is separate from the memory 102 and ECC values are not stored in the memory 102. In other implementations of the data storage circuit 100, the ECC storage circuit 104 is part of the memory 102 and ECC values are stored in the memory 102. Some implementations of the ECC storage circuit 104 include flip-flops 110, rather than memory cells, that store the ECC values. That is, each bit of each ECC value may be stored in a flip-flop 110 of the ECC storage circuit 104. Each ECC value stored in the ECC storage circuit 104 corresponds to and protects a data value, and all of the multiple fields of the data value, stored in the memory 102. The ECC storage circuit 104 may include multiplexer circuitry to route a selected ECC value to the outputs 132, and enable circuitry to select the flip-flops 110 into which an ECC value is stored. The ECC values stored in the ECC storage circuit may be applied to detect errors in a corresponding data value, and, in some implementations, to correct errors in the corresponding data value.

The ECC generation circuit 106 is coupled to the ECC storage circuit 104. The ECC generation circuit 106 computes ECC values for storage in the ECC storage circuit 104. Some implementations of the ECC generation circuit 106 include two layers of ECC computation circuitry: layer 112 and layer 114. Data being written to the memory 102 (e.g., a field value being written to the memory 102) is received by the layer 112 for use in computation of an ECC value. A stored ECC value retrieved from the ECC storage circuit 104 and corresponding to the data value that includes the field being written to the memory 102 is received at the layer 114. The ECC generation circuit 106 generates an updated ECC value based on the data being written to the memory 102 and the ECC value retrieved from the ECC storage circuit 104, and the updated ECC value is stored in the ECC storage circuit 104 as directed by the control signals 122, which may include address signals, write control signals, etc.

The control circuit 108 controls operation of the memory 102 and the ECC storage circuit 104. When a field value to be written to the memory 102 is received from a circuit external to the data storage circuit 100, the control circuit 108 generates the control signals 122 that cause the memory 102 to write the field value to memory cells corresponding to a field of a data value (without reading the field value or any portion of the data value incorporating the field). The control circuit 108 also generates the control signals 122 that cause the ECC storage circuit 104 to retrieve the ECC value for the data value that includes the field being written and to write the updated ECC value to the ECC storage circuit 104.

The control circuit 108 may also control initialization of the memory 102 and the ECC storage circuit 104. In some implementations, initialization is performed prior to writing any data received from a source external to the data storage circuit 100 to the memory 102. The initialization includes writing a predetermined value (e.g., zero) to all locations of the memory 102 that are used to store a data value, and writing a predefined value (e.g., zero) that defines an ECC value for a data value stored in the memory 102 to all locations of the ECC storage circuit 104 that are used to store an ECC value. For example, the control circuit 108 may execute a write cycle corresponding to each storage location of the memory 102 and provide the predetermined value to be written into the storage location. Some implementations of the control circuit 108 may provide a control signal 128 to set the flip-flops 110 to the predefined value asynchronously or to cause the ECC storage circuit 104 to write the predefined value on each write cycle (each write the memory 102) while the control signal 128 is asserted. Initialization of the memory 102 and the ECC storage circuit 104 allows the ECC generation circuit 106 to compute an updated ECC value without needing to consider the value of fields of data value that have not been written since the initialization.

In some implementations of the data storage circuit 100, initialization is performed on-the-fly. For example, when a selected field of a data value is being written, the predetermined value may be simultaneously written to all other fields of the data value. The ECC value corresponding to the data value may asynchronously set the predefined value, or the predefined value may be provided at the outputs 132 of the ECC storage circuit 104 or the feedback inputs of the ECC generation circuit 106.

In some implementations of the data storage circuit 100, when a data value has been read from the memory 102 by circuitry external to the data storage circuit 100, and is no longer needed, memory cells used to store the data value, and the corresponding ECC value may be initialized prior to receipt of a field value to be written to the data value. For example, if each data value stored in the memory 102 were read from the memory 102 via a single read access, then completion of the read access may trigger initialization of the data value and the corresponding ECC value.

Figure 2:
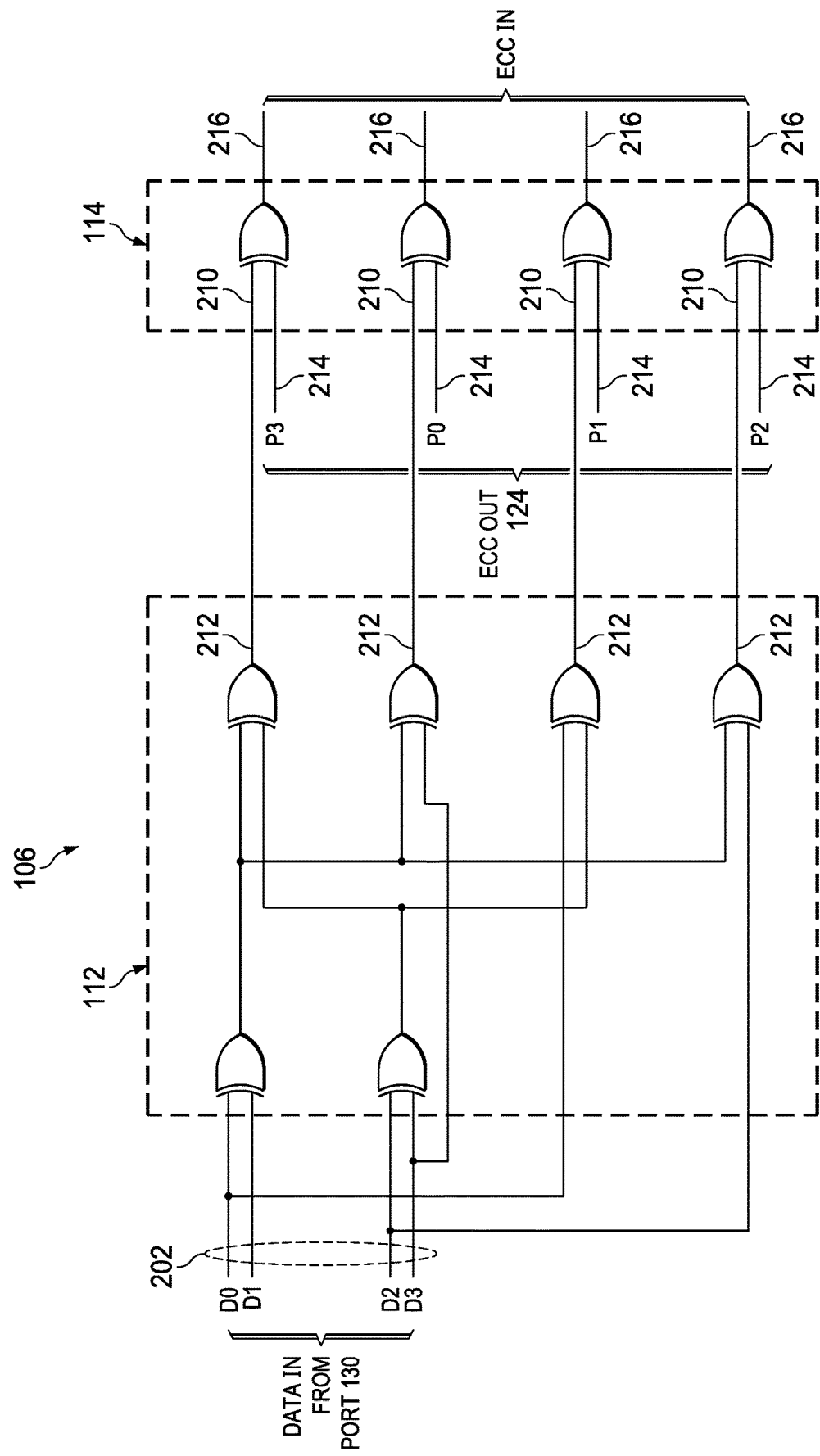
FIG. 2 shows a schematic diagram for an example ECC generation circuit in accordance with the present disclosure.

FIG. 2 shows a schematic diagram for an implementation of the ECC generation circuit 106. While the ECC generation circuit 106 is illustrated as a particular width (i.e., processing a particular number of bits of a field value) to facilitate explanation, implementations of the ECC generation circuit 106 may be of any width. The ECC generation circuit 106 includes the layer 112 and the layer 116. The layer 112 includes exclusive-OR circuitry that combines the bits of the field value being written to the memory 102. Inputs 202 of the layer 112 are coupled to a port 130 that provides the field value to the memory 102. Input data processed in the layer 112 may include only the bits of the field value being written to the memory 102 and filler values (e.g., zero bits). No data read from the memory 102 or the ECC storage circuit 104 is fed back into the layer 112. The depth of the layer 112 may vary with the width of the input data value. In various implementations, the exclusive-OR circuitry may be implemented using exclusive-OR gates, exclusive-NOR gates or other circuitry that provides equivalent functionality.

The layer 114 includes exclusive-OR circuitry that combines the outputs 212 of the layer 112 and the bits of the ECC value retrieved from the ECC storage circuit 104. The layer 114 includes inputs 210 that are coupled to the outputs 212 of the layer 112, and inputs 214 that are coupled to the outputs 132 of the ECC storage circuit 104. No data read from the memory 102 is fed back into the layer 112. The outputs 216 of the layer 114 are coupled to the ECC value inputs 134 and to inputs of the flip-flops 110 of the ECC storage circuit 104.

As shown in FIG. 2, each bit of the ECC value 124 retrieved from the ECC storage circuit 104 is propagated back to the ECC storage circuit 104 through a single logic gate (i.e., an exclusive-OR gate) in some implementations. Thus, implementations of the ECC generation circuit 106 reduce the delay associated with computation of an updated ECC value for a field value being written to the memory 102.

Figure 3:
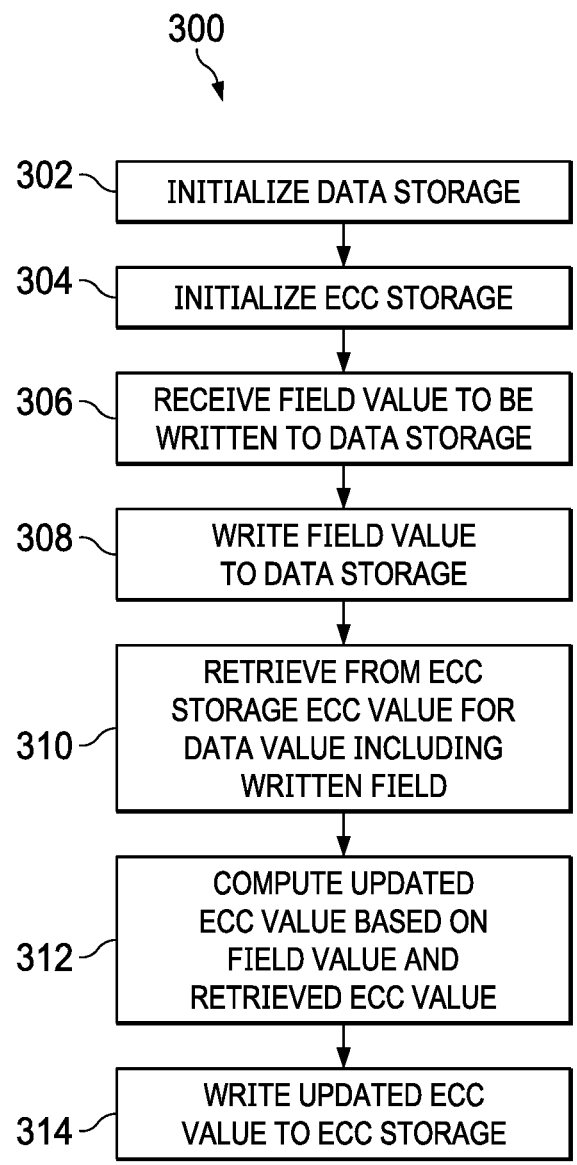
FIG. 3 shows a flow diagram for an example method for storing data in accordance with the present disclosure.

FIG. 3 shows a flow diagram for an example method 300 for storing data in accordance with the present disclosure. Though depicted sequentially as a matter of convenience, at least some of the actions shown can be performed in a different order and/or performed in parallel. Additionally, some implementations may perform only some of the actions shown. Operations of the method 300 may be performed by implementations of the data storage circuit 100.

In block 302, the memory 102 is initialized such that all of the storage locations of the memory 102 contain a predetermined value, such as zero. For example, the control circuit 108 may initiate write cycles that write the predetermined value into each storage location of the memory 102 that is used to store a data value. Some implementations of the method 300 may initialize the storage locations of the memory 102 on-the-fly.

In block 304, the ECC storage circuit 104 is initialized such that all of the storage locations of the ECC storage circuit 104 contain a predefined value, such as zero. The predefined value represents the ECC value for the predetermined data value stored in the memory 102 in block 302. For example, the control circuit 108 may activate the control signal 128 that asynchronously clears the flip-flops 110 or causes the ECC value written into the ECC storage circuit 104 with each write to the memory 102 to be set to the predefined value. Some implementations of the method 300 may initialize the storage locations of the ECC storage circuit 104 on-the-fly.

In block 306, the data storage circuit 100 receives a field value to be written to a field of a data value stored in the memory 102. The memory 102 allows each field of the data value to be independently written (i.e., written without writing any other field to the memory 102 or reading any field of the data value from the memory 102).

In block 308, the control circuit 108 produces control signals 122 that cause the memory 102 to store the field value in the memory 102 without reading any field of the data value that includes the field being written (i.e., without performing a read-modify-write operation).

In block 310, responsive to the control signals 122 produced by the control circuit 108, the ECC storage circuit 104 retrieves an ECC value corresponding the data value that includes the field being written in block 308. For example, address signals generated by the control circuit 108 may cause multiplexing circuitry in the ECC storage circuit 104 to route the output of flip-flops 110 storing the ECC value to the outputs 132 of the ECC storage circuit 104.

In block 312, the ECC generation circuit 106 combines the field value written to the memory 102 in block 308 and the ECC value retrieved from the ECC storage circuit 104 in block 310 to produce an updated ECC value. For example, the field value may be provided as input to a first layer 112 of exclusive-OR circuitry, and the outputs of the first layer 112 of exclusive-OR circuitry combined with the ECC value retrieved from the ECC storage circuit 104 in block 310 in a second layer 114 of exclusive-OR circuitry to produce the updated ECC value.

In block 314, the updated ECC value is stored in the ECC storage circuit 104 in place of the ECC value retrieved in block 310.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A data storage circuit, comprising:
    memory configured to store a data value comprising a plurality of fields, wherein each of the fields is independently writable;
    an error correcting code (ECC) storage circuit configured to store an ECC value corresponding the data value; and
    control circuitry configured to:
        receive a field value to be written into one of the fields;
        store the field value in the one of the fields by writing only the field value to the memory;
        retrieve the ECC value from the ECC storage circuit;
        compute an updated ECC value based on the ECC value retrieved from the ECC storage circuit and the field value; and
        store the updated ECC value in the ECC storage circuit.

2. The data storage circuit of claim 1, wherein the control circuitry is configured to initialize storage locations of the memory selected to store the data value to a predetermined value.

3. The data storage circuit of claim 2, wherein the control circuitry is configured to initialize storage locations of the ECC storage circuit selected to store the ECC value to a predefined value corresponding to the predetermined value.

4. The data storage circuit of claim 1, wherein the ECC storage circuit comprises one or more flip-flops configured to store the ECC value.

5. The data storage circuit of claim 1, further comprising ECC generation circuitry configured to compute the updated ECC.

6. The data storage circuit of claim 5, wherein the ECC generation circuitry comprises:
    a first layer of exclusive-OR circuitry configured to combine bits of the field to be written; and
    a second layer of exclusive-OR circuitry configured to combine an output of the first layer of exclusive-OR with the ECC value retrieved from the ECC storage circuit;
    wherein the second layer of exclusive-OR circuitry is a single logic gate in depth.

7. The data storage circuit of claim 1, wherein the control circuitry is configured to store the field value in the one of the fields without execution of a read modify-operation with regard to any of the fields.

8. A data storage circuit, comprising:
    memory comprising a plurality of independently writable fields;
    an error correcting code (ECC) storage circuit comprising storage locations for an ECC value corresponding to the plurality of independently writable fields; and
    an ECC generation circuit coupled to the ECC storage circuit, and comprising:

a first layer of exclusive-OR circuitry comprising inputs coupled only to a port that provides a field value to be written into one of the independently writable fields;

a second layer of exclusive-OR circuitry comprising:
  inputs coupled to outputs of the first layer of exclusive-OR circuitry;
  inputs coupled to outputs of the ECC storage circuitry; and
  outputs coupled to inputs of the ECC storage circuitry.

9. The data storage circuit of claim 8, wherein the storage locations of the ECC storage circuit comprise a plurality of flip-flops, each of the flip-flops comprising an input coupled to one of the outputs of the third layer of exclusive-OR circuitry.

10. The data storage circuit of claim 8, wherein the first layer of exclusive-OR circuitry comprises a plurality of exclusive-OR gates, each input of each of the exclusive-OR gates coupled to the port.

11. The data storage circuit of claim 10, wherein the second layer of exclusive-OR circuitry comprises a plurality of exclusive-OR gates, each input of each of the exclusive-OR gates of the second layer of exclusive-OR circuitry coupled to an output of one of the exclusive-OR gates of the first layer of exclusive-OR circuitry or to an output of the ECC storage circuitry.

12. The data storage circuit of claim 8, wherein the second layer of exclusive-OR circuitry is a single logic gate in depth.

13. The data storage circuit of claim 8, further comprising control circuitry coupled to the memory and to the ECC storage circuit; the control circuitry configured to:
  initialize the storage locations of the memory to a predetermined value; and
  initialize the storage locations of the ECC storage circuitry to a predefined value corresponding to the predetermined value.

14. The data storage circuit of claim 8, further comprising control circuitry configured to write each of the independently writable fields and the ECC value without reading any of the independently writable fields.

15. A method for storing data, comprising:
  receiving, by a control circuitry, a field value to be written into one of a plurality of independently writable fields of a memory;
  retrieving, by the control circuitry from an ECC storage circuit, an ECC value corresponding to the plurality of independently writable fields;
  computing, by the control circuitry, an updated ECC value based only on the field value and the ECC value; and
  storing, by the control circuitry, the updated ECC value in the ECC storage circuit.

16. The method of claim 15, further comprising, by the control circuitry, initializing storage locations of the memory selected to store the plurality of independently writable fields to a predetermined value prior to receipt of the field value.

17. The method of claim 16, further comprising initializing, by the control circuitry, storage locations of the ECC storage circuit selected to store the ECC value to a predefined value corresponding to the predetermined value prior to receipt of the field value.

18. The method of claim 15 wherein computing the updated ECC value comprises passing each bit of the ECC value through a single layer of logic gates.

19. The method of claim 15, further comprising initializing, by the control circuitry, storage locations of the memory selected to store the plurality of independently writable fields to a predetermined value simultaneous with writing the field value to one of the independently writable fields.

20. The method of claim 15, wherein storing the updated ECC value comprising storing the ECC value in one or more flip-flops of the ECC storage circuit.

* * * * *